United States Patent [19]

Herzog

[11] 4,052,673
[45] Oct. 4, 1977

[54] COMBINED CONTROLLED OSCILLATOR AND FREQUENCY MULTIPLIER

[75] Inventor: Gerald Bernard Herzog, Princeton, N.J.

[73] Assignee: RCA Corporation, New York, N.Y.

[21] Appl. No.: 718,802

[22] Filed: Aug. 30, 1976

[51] Int. Cl.² .......................... H04B 1/04; H04B 1/28; H03B 19/10; H03B 25/00

[52] U.S. Cl. ................................ 325/153; 307/225 C; 325/146; 328/17; 328/38; 331/57; 331/108 A

[58] Field of Search .................... 325/146, 148, 153; 331/57, 60, 76, 108 A, 108 B, 117 R, 135; 307/271, 225 R, 225 C; 328/15–17, 21, 38

[56] References Cited

U.S. PATENT DOCUMENTS

| 3,202,840 | 8/1965 | Ames, Jr. | 328/16 |
| 3,218,576 | 11/1965 | Winpisinger | 331/117 |
| 3,428,913 | 2/1969 | Pechoucek | 331/57 |
| 3,676,801 | 7/1972 | Musa | 331/116 R |
| 3,931,588 | 1/1976 | Gehweiler | 331/57 |

Primary Examiner—Robert L. Griffin
Assistant Examiner—Marc E. Bookbinder
Attorney, Agent, or Firm—Eugene M. Whitacre; Peter M. Emanuel

[57] ABSTRACT

A voltage controlled oscillator which, for example, may be utilized in a phase locked loop, includes an odd number ($n$) of cascaded COS-MOS inverter stages with a feedback path coupling the output of the last stage to the input of the first stage to form a ring configuration. The ring configuration oscillates at a frequency $f_1$ determined by the transconductances of the inverter stages and the shunt capacitances between the stages. Signals comprising impulses of current having frequency components at $f_1$ and $2f_1$ flow through the power supply inputs of each of the stages as they successively are switched from one state to another. A frequency selective impedance path is coupled between a source of power supply voltage and the power supply inputs of each of the stages to develop a second signal having a frequency $f_2$ equal to a multiple $nf_1$ or $2nf_1$. The voltage applied to the commonly connected power supply inputs may be controlled to control $f_1$ and, consequently, $f_2$.

14 Claims, 3 Drawing Figures

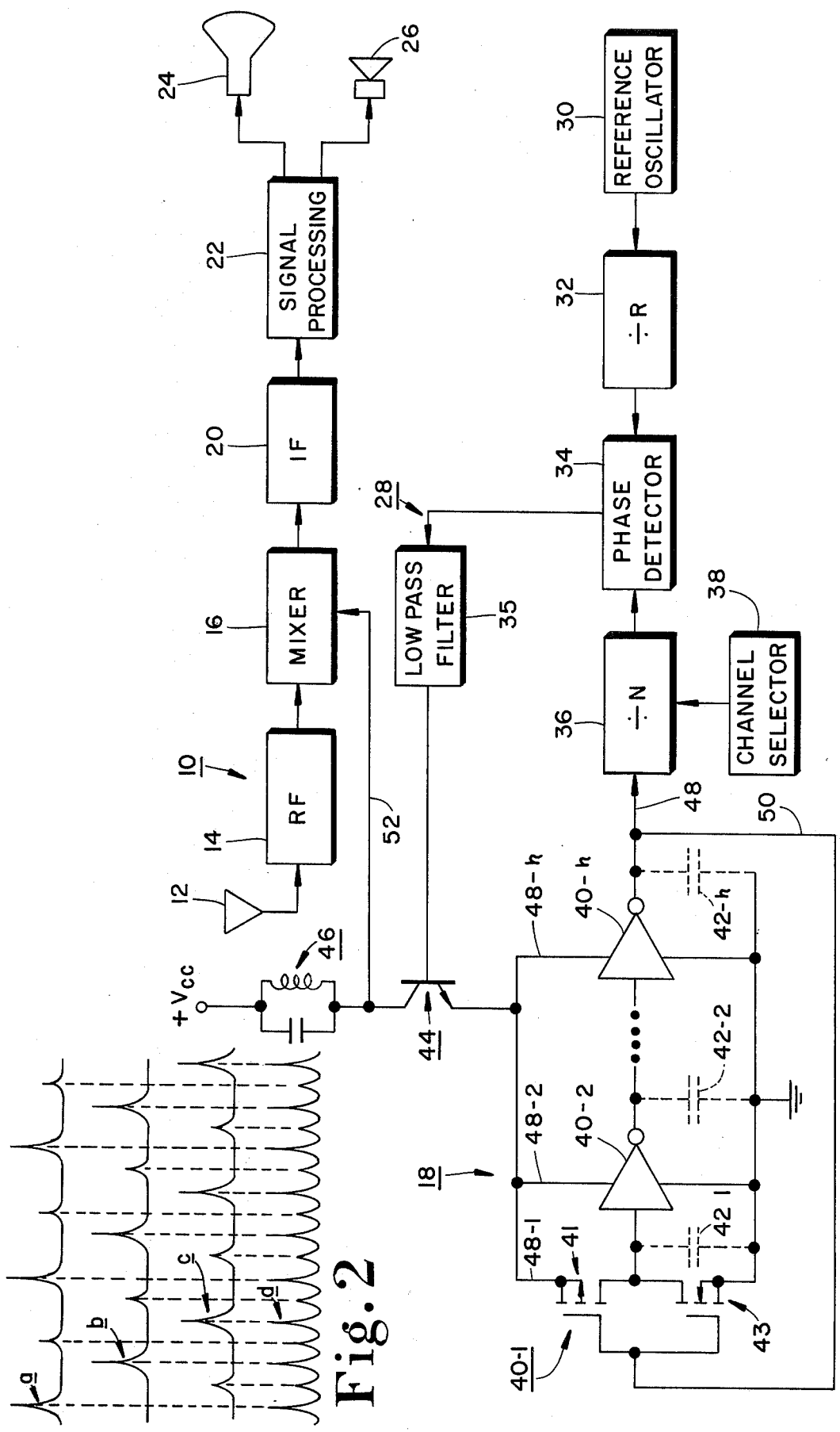

COMBINED CONTROLLED OSCILLATOR AND FREQUENCY MULTIPLIER

The present invention is directed to the field of oscillators which are capable of providing a signal having a frequency which is a multiple of the frequency of the oscillator.

Phase locked loops are desirable in many applications since they provide an output signal with a frequency having an accuracy and stability primarily determined by a frequency reference to which the frequency of the output signal is synchronized by the phase locked loop. Furthermore, the frequency of the output signal may be readily controlled by changing the factor by which a programmable counter included in the phase locked loop counts. Examples of phase locked loops and their applications are described, for example, in RCA application note ICAN-6101 appearing, for example, in the "RCA Solid State '74 Databook SSD-203B" published by RCA Corporation.

For the above reasons, much interest has recently been shown in the utilization of phase locked loops in such applications as controlling the frequency of a local oscillator signal to tune a radio or television receiver and controlling the frequency of signals to be transmitted by a transmitter. For example, a phase locked loop utilized in a tuning system for a television is described in copending U.S. patent application Ser. No. 632,060 filed in the name of J. G. N. Henderson on Nov. 14, 1975, now abandoned.

Controlled oscillator arrangements for use, for example, in television tuning phase locked loops should desirably be capable of providing relatively high frequency local oscillator signals (e.g., in the United States, in a range between 101 and 931 MHz). Since programmable counters which may be utilized in a phase locked loop cannot readily process relatively high frequency, e.g., much above 20 MHz signals, a phase locked loop tuning system generally includes a high speed frequency divider or prescaler to divide the frequencies of local oscillator signals before they are coupled to a programmable counter included in the phase locked loop. Unfortunately, these high speed prescalers are relatively complex and therefore relatively expensive.

Many varieties of controlled oscillators are known. One such oscillator, described in U.S. Pat. No. 3,931,588 entitled, "Voltage Controlled Oscillator Utilizing Field Effect Transistors", issued in the name of W. F. Gehweiler on Jan. 6, 1976 includes an odd number of cascaded inverter stages coupled in a ring configuration. The frequency of an output signal, taken at the output of any stage, may be controlled by controlling the voltage applied to a common control terminal coupled to each stage. Other controlled oscillators, similar in some respects to the oscillator described in the Gehweiler patent, are described in U.S. Pat. Nos. 3,428,913; 3,553,484; and 3,831,112. Unfortunately, because of the relatively high local oscillator frequencies employed, separate frequency multipliers may be required if these oscillators are to be utilized in a television tuning system.

Frequency multiplier arrangements are known in which a circuit is shock excited at a fundamental frequency and produces a damped oscillation, i.e., rings, at a harmonic frequency. Arrangements are also known wherein a signal is coupled to a delay device which generates various delayed signals. The delayed signals are summed to produce a signal having a frequency which is a multiple of the frequency coupled to the delay device.

In accordance with the present invention, an arrangement which may be utilized, for example, as a combined controlled oscillator and frequency multiplier in a phase locked loop of a receiver or transmitter comprises a number n of stages coupled in a cascade configuration, each to be successively switched from a first state to a second state to develop at least a first signal having a first frequency $f_1$. An equal number of power coupling means are coupled to respective stages for coupling power thereto. Each of the stages is arranged so that it draws power for a time interval shorter than the period of said first signal when it switches from one state to another. A source of power is coupled through impedance means to each of the power coupling means. A second signal having a frequency component at $nf_1$ is developed by the impedance means.

In accordance with another feature of the present invention, the second signal also has a frequency component at $2nf_1$ and the impedance means includes a frequency selective element broadly tuned to one of the frequency components of the second signal.

In accordance with another feature of the present invention, the cascaded configuration includes an odd number of signal inverting stages coupled to form a ring arrangement which oscillates at $f_1$.

In accordance with still another feature of the present invention, the power supplied to an odd number of inverting stages arranged in an oscillatory ring configuration is controlled to control the frequency $f_1$.

BRIEF DESCRIPTION OF THE DRAWINGS

FIG. 1 shows partially in schematic form and partially in block diagram form an embodiment of the present invention employed in a phase locked loop tuning system of a television receiver;

FIG. 2 is a graphical representation of waveforms which facilitate an understanding of the embodiment of the present invention shown in FIG. 1.

Figure 3:
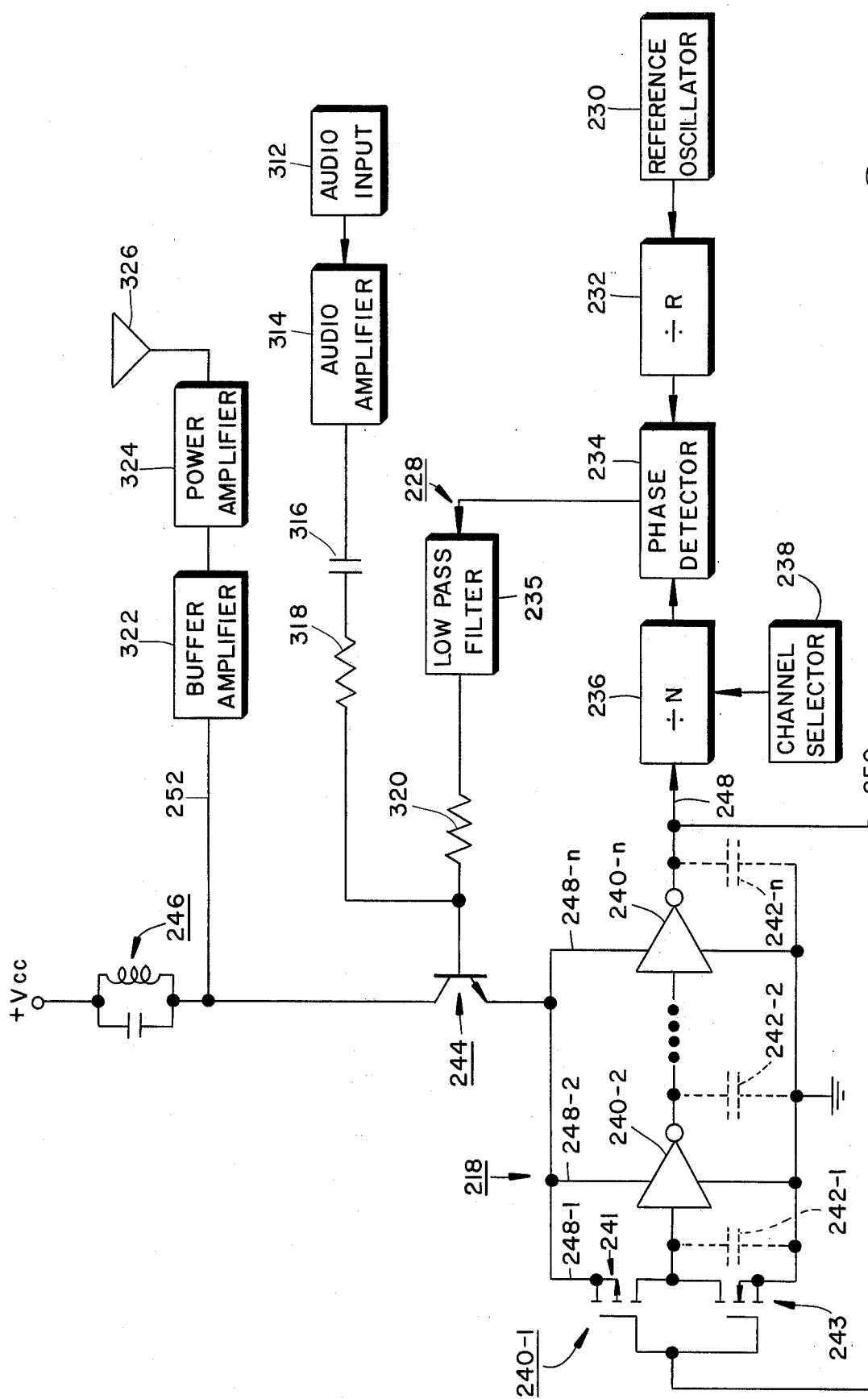
FIG. 3 shows partially in schematic form and partially in block diagram form an embodiment of the present invention employed in a phase locked loop system for generating a signal to be transmitted by a transmitter.

A television receiver 10 of FIG. 1 includes an antenna 12 for receiving radio frequency (RF) television carriers and an RF processing unit 14 for amplifying and otherwise processing received carriers. The processed RF signals are combined with local oscillator signals generated by an oscillator 18 in a mixer 16 to develop intermediate ferequency (IF) signals. The IF signals are amplified, filtered and otherwise processed in an IF processing unit 20 and thereafter coupled to a signal processing unit 22. Signal processing unit 22 processes video and audio components of the output signal of IF processing unit 20 to produce an image on a kinescope 24 and provide corresponding audio information by means of a speaker 26.

The frequency of the local oscillator signal is controlled by a phase locked loop tuning system 28. Phase locked loop tuning system 28 includes a reference oscillator 30 which, for example, may comprise a crystal oscillator to generate a signal having an accurate and stable fixed frequency. The output signal of reference oscillator 30 is coupled to a divide-by-R divider 32, which may, comprise a binary counter, wherein its input clock frequency is divided by a factor R.

A signal having a frequency which is an odd submultiple of the local oscillator signal coupled to mixer 16, generated in a manner to be described, is coupled by connection 48 to a divide-by-N divider 36 which divides the frequency by a factor N controlled in accordance with the channel selected by means of a channel selector unit 38. Divide-by-N divider 36 may, for example, comprise a programmable counter arrangement which counts N cycles of its input signal during every cycle of its output signal, N being controlled in response to BCD (binary coded decimal) signals representing the selected channel.

The output signals of divide-by-N divider 36 and divide-by-R divider 32 are coupled to a phase detector 34 which generates a signal representing the phase and frequency deviation between its two input signals. For example, phase detector 34 may provide a series of pulses the duration of which is dependent on the relationship between the phase and frequency of the output signals of divide-by-R divider 32 and divide-by-N divider 36. The output signal of phase detector 34 is filtered by a low pass filter 35 to derive a DC control voltage for oscillator 18.

Components of the phase locked loop described in the aforementioned RCA Application Note ICAN 6101 are suitable for use in phase locked loop 28.

Local oscillator 18 comprises an odd number (n) of cascaded logic inverter stages 40-1 through 40-n with the output of the last stage (40-n) coupled by a feedback path 50 to the input of the first stage (40-1) so as to form an oscillatory ring configuration. Although inverters 40-2 and 40-n are shown in logic diagram form for the sake of simplicity of drawing, they are formed in the same manner as inverter 40-1. Inverter 40-1 is comprised of a P-channel metal oxide semiconductor (MOS) field effect transistor (FET) 41 coupled to an N-channel MOS FET 43 to form a complementary symmetry metal oxide semiconductor (COS/MOS) inverter such as described in the "RCA COS/MOS Integrated Circuits Manual" published by the RCA Corporation, Solid State Division, Somerville, New Jersey. Parasitic capacitances 42-1 through 42-n shunt the outputs of each of the stages 40-1, 40-2 and 40-n, respectively.

Power is coupled from a source of positive supply voltage (+VCC) to the commonly connected power supply inputs 48-1, 48-2 and 48-n of stages 40-1, 40-2 and 40-n, respectively, through a tuned circuit 46 and the collector-emitter junction of an NPN transistor 44. The power supply returns of inverters 40-1, 40-2 and 40-n are coupled to ground. Transistor 44 is arranged as an emitter-follower having its base coupled to the output of phase detector 34.

In operation, assuming for the moment that the output voltage of phase detector 34 is constant, the ring configuration of inverter stages 40-1 through 40-n oscillates at a frequency $f_1$ determined by the transconductance and parasitic capacitance associated with each stage as is explained in the aforementioned Gehweiler patent. The signal developed at the ouput of a particular stage is delayed from the signal developed at the output of the previous stage by a time corresponding to the propagatopm delay of the particular stage. Because the delays associated with each stage determine the frequency of oscillation $f_1$, the delay associated with each stage corresponds to a phase shift of $180°/n$, at the frequency of oscillation $f_1$ (assuming that the delays of all the stages are equal.) Where n is small, the devices operate at a frequency where their gain-phase characteristic is such that the voltage output for each stage approximates a sinewave. Where n is large, e.g., 7, 9, 11 etc., the waveform will be more nearly a square wave. In either case, however, the current that flows in power supply lines 48-1, 48-2 and 48-n comprises a series of pulses of short duration as will be described. The output from the last stage (40-n) is coupled to phase detector 34 although the output signals of either of the other stages, e.g., 40-1 or 40-2 may alternatively be coupled to phase detector 34.

As the output of each stage switches from one outut level to the other in response to the output signal of the preceding stage, a series of impulses (i.e, pulses of relatively short duration) of current are caused to flow through the power supply input 48-1, 48-2 or 48-n of the stage. The series of pulses of current flowing through the power supply input 48-1, 48-2 or 48-n of the stage is formed by the combination of two components. The first component comprises a first series of impulses of current each of which is drawn through the stage's power supply each time a low impedance path is formed between the stage's power supply input and ground as one FET comprising the stage is turned off and the other is substantially simultaneously, turned on. That is, there is an instant during each transition when both FETs comprising a stage are conductive thereby providing a low impedance path between the stage's power supply input and ground through which an impulse of current can flow. The current impulses of the first component occur when the stage's P-channel FET (such as FET 41) is turned on and the stage's N-channel FET (such as FET 43) is turned off and also when the stage's N-channel FET is turned on and the stage's P-channel FET is turned off. Therefore, the current impulses of the first component occur at a frequency $2f_1$.

The second component comprises a second series of pulses of current each of which is due to the surge of current drawn through the stage's power supply input to charge (i.e., raise the voltage developed across) the capacitor coupled to the output of the stage each time the stage's P-channel FET (such as FET 41) is turned on. Since the stage's P-channel is turned on only during alternate impulses of current comprising the first component, the impulses of current comprising the second component occur in synchronism with alternate impulses of current comprising the first component and therefore have a frequency $f_1$. The first and second components are summed in the stage's power supply line to form a signal comprising a series of relatively high amplitude impulses at a frequency $f_1$ and a series of relatively lower amplitude impulses also at a frequency $f_1$ but with each of the lower amplitude impulses occurring between adjacent impulses of the higher amplitude impulses. Thus, in summary, the signal developed in the power supply lines of each stage includes a frequency component at $f_1$ and $2f_1$. Waveforms a, b and c of FIG. 2 correspond to the signals developed in the power supply lines of the three inverter stages forming a ring configuration when n is equal to three.

The impulse signals developed in the power supply lines of stages 40-1, 40-2 and 40-n are summed in the impedance path between the source of supply voltage (+VCC) and the commonly connected power supply inputs of the stages and results in the development of a signal at the collector of transistor 44 having a frequency $f_2$ which is either n or 2n (depending on the resonant frequency of tuned circuit 46 as will later be explained) times the frequency $f_1$ of the ring configuration itself. The relatively high frequency ($nf_1$ or $2nf_1$) signal developed at the collector of transistor 44 is utilized as the local oscillator signal and is coupled to mixer 16 via a conductor 52. As shown in FIG. 2, with three stages the frequency of the signal d developed in the path between the source of +VCC and the commonly connected power supply inputs of the inverters has a frequency three times the frequency ($f_1$) provided by the ring configured oscillator itself.

Because the transconductance characteristic of each stage is a function of the supply voltage, the frequency of oscillation, i.e., $f_1$, of the oscillator 18 is a function of the voltage applied to the commonly connected power supply inputs of the inverter stages 40-1, 40-2 and 40-n. The variation of the frequency of oscillation of an oscillator including field effect transistors arranged in a complementary configuration with power supply variations is described as an undesirable characteristic in U.S. Pat. No. 3,725,822 issued in the name of S. S. Eaton on Apr. 3, 1973. Correspondingly, the frequency multiplied output signal developed in the impedance path (i.e., at conductor 52) is also a function of the signal applied to the commonly connected power supply inputs of inverters 40-1, 40-2 and 40-n.

The frequency control characteristic of oscillator 18 is advantageously employed in tuning system 28. The control voltage developed by phase detector 34 and low pass filter 35 is coupled to the commonly connected power supply inputs 48-1, 48-2 and 48-n through emitter-follower configured transistor 44. To ensure the proper operation of oscillator 18, the lowest value of the control voltage should desirably be chosen greater than the threshold voltage as defined, for example, in the aforementioned RCA "COS/MOS Integrated Circuits Manual" of the inverter stages 40-1, 40-2 and 40-n. The control voltage continues to be varied until the phase and frequency of the divide-by-N and divide-by-R output signals reach a predetermined (e.g., substantially equal) phase and frequency relationship. At this point, the phase locked loop 28 is said to be locked. Under these conditions, the frequency $f_{LO}$ of the local oscillator signal will be related to the frequency $f_{REF}$ of the reference frequency signal output of divide-by-R divider 32 by $$f_{LO} = f_2 = nNf_{REF} \quad (1)$$

or $$f_{LO} = f_2 = 2nNf_{REF} \quad (2)$$

depending on the frequency to which tuned circuit 46 is tuned.

Tuned circuit 46 is broadly tuned to a frequency corresponding to the frequency of the signal developed in the power supply impedance path when an nominal midrange voltage is applied to the commonly connected power supply inputs of inverters 40-1, 40-2 and 40-n via transistor 44 so that the local oscillator signal is relatively free of undesired frequency components.

It is noted that while a relatively high frequency local oscillator signal is synthesized by tuning system 28, it is accomplished by synchronizing the relatively low frequency output signal of oscillator 18 developed at the output of stage 40-n rather than by dividing the frequency of the local oscillator by means of a relatively complex and expensive prescaler conventionally employed in phase locked loop tuning systems.

A configuration similar to the oscillator 18 of FIG. 1 utilizing three CD4007 COS/MOS integrated circuit inverters, available from the RCA Corporation, provided a fundamental oscillation frequency ($f_1$) of approximately 6⅔ MHz in response to a 7 volt control voltage and a fundamental oscillation frequency of approximately 10 MHz in response to 10 volt control voltage. This corresponds to a multiple frequency ($f_2$) output of 20 and 30 MHz, respectively.

It will be appreciated that modifications to the embodiment shown in FIG. 1 are contemplated to be within the scope of the present invention. For example, while emitter-follower, transistor 44 is desirable since it not only serves as means for coupling a control voltage to oscillator 18 but also serves as a buffer between low pass filter 35 and oscillator 18, it is not necessary to use such an arrangement. If it is desired to omit transistor 44 and directly couple tuned circuit 46 to the commonly connected power input terminals of inverters 40-1, 40-2 and 40-n, the control voltage may, for example, be coupled to the terminal to which the +VCC voltage is presently coupled in FIG. 1. Further, tuned circuit 46 may be included in the power return lines of the stages which are coupled to ground. Still further, it may be desirable to couple discrete capacitor between the inverter stages, in addition to the parasitic capacitances 42-1 through 42-n, to equalize the propagation delay between successive stages so that a more symmetrical and therefore purer frequency signal may be developed at conductor 52. Still further, while oscillator 18 was described as being formed by COS/MOS inverters, other types of inverters may be utilized. For example, complementary SOS (silicon or sapphire) inverters may be also used. Moreover, other types of stages which may be formed to provide impulses of current whose duration is substantially less than the duration of the period of the ring configuration output signal may also be utilized.

In addition, it is contemplated that the embodiment shown in FIG. 1, and modifications thereof, may be employed in applications other than a phase locked loop tuning system. For example, as shown in FIG. 3, a phase locked loop employing a controlled oscillator constructed in accordance with the present invention may be utilized to generate a frequency modulated (FM) carrier to be transmitted by a transmitter.

The FM transmitter of FIG. 3, which may, for example, comprise the transmitter portion of a transceiver, includes a phase locked loop 228 to synthesize the nominal carrier frequencies associated with various transmission channels. The components of phase locked loop 228, including a voltage controlled oscillator 218, identified by reference numbers in the 200 series, are similar to corresponding components of phase locked loop 28 of the tuning system of FIG. 1 having the same two last digits.

When a user selects a transmission channel by means of a channel selector 238, binary coded signals are coupled to a divide-by-N divider 236 to control the factor N by which it divides. Thereafter voltage controlled oscillator 218 generates a signal at conductor 252 having a frequency controlled in response to the DC control signal developed by a low pass filter 235 of phase locked loop 228. Depending on the frequency to which a tuned circuit 246 is broadly tuned (i.e., either $nf_1$ or $2nf_1$) the frequency signal of the signal developed at conductor 252 has a nominal frequency defined by either expression (1) or (2).

In addition, audio frequency signals developed by an audio input unit 312, which may, for example, comprise a microphone, are amplified by an audio amplifier 314 and capacitively coupled through a capacitor 316 to a summing circuit comprising resistors 318 and 320. The summing circuit combines the amplified audio signal with the D.C. control signal. As a result, the signal developed at conductor 252 is frequency modulated in accordance with the audio information contained in the audio signal about the nominal frequency defined above. The frequency modulated signal developed at conductor 252 is successively amplified by a buffer amplifier 322 and a power amplifier 324 and transmitted by means of a transmitting antenna 326.

What is claimed is:

1. Apparatus comprising:
   means for coupling a first signal having a frequency $f_1$ to a circuit point;
   a number $n$ of stages coupled in a cascaded configuration, said circuit point being an input to said cascaded configuration, each of said stages being, successively switched from a first state to a second state in response to said first signal each of said stages drawing power for a time duration shorter than the period of said first signal when it switches from one state to another;
   said number $n$ of power coupling means for providing power to respective ones of said stages;
   a source of power;
   impedance means coupled between each of said power coupling means and said source of power for developing a second signal having at least a frequency component at $nf_1$.

2. The apparatus recited in claim 1 wherein said second signal additionally has a frequency component at $2nf_1$.

3. The apparatus recited in claim 2 wherein said impedance means includes frequency selective means broadly tuned to said frequency $nf_1$.

4. The apparatus recited in claim 2 wherein said impedance means includes frequency selective means broadly tuned to one of said frequencies $nf_1$ or $2nf_1$.

5. The apparatus recited in claim 2 wherein said impedance means includes frequency selective means and buffer means coupled between said frequency selective means and each of said power coupling means.

6. The apparatus recited in claim 5 further including means for generating a control signal for controlling said first frequency $f_1$; and wherein said buffer means includes a transistor arranged in an emitter-follower configuration, said control signal being coupled to the base of said transistor.

7. The apparatus recited in claim 1 wherein said stages each comprise signal inverting means; said number $n$ is an odd number; and said signal inverting means are cascaded to form a ring configuration which oscillates at said first frequency $f_1$.

8. The apparatus recited in claim 7 wherein said signal inverting stages comprise field effect transistors of opposite type coupled in a complementary configuration.

9. The apparatus recited in claim 7 further including control means for generating a control signal, said control signal being coupled to said ring configuration to control the frequency of said first signal.

10. The apparatus recited in claim 9 wherein said control means is coupled to said impedance means to control the power coupled to said stages.

11. The apparatus recited in claim 9 wherein said control means comprises a phase locked loop including a source of a frequency reference signal; means responsive to said frequency reference signal and to said first signal for generating an error signal representing the phase and frequency relationship between said frequency reference signal and said first signal; and means for deriving said control signal in response to said error signal.

12. The apparatus recited in claim 11 wherein said second signal is coupled to a means for combining said second signal and a radio frequency signal to derive an intermediate frequency signal.

13. The apparatus recited in claim 11 wherein said second signal is coupled to transmitting means.

14. The apparatus recited in claim 13 wherein said control means comprises means for controlling the amplitude of said control signal in response to an information bearing signal.

* * * * *